US010625312B2

(12) United States Patent
Dickinson

(10) Patent No.: US 10,625,312 B2
(45) Date of Patent: Apr. 21, 2020

(54) PLASMA ABATEMENT SOLIDS AVOIDANCE BY USE OF OXYGEN PLASMA CLEANING CYCLE

(71) Applicant: Applied Materials, Inc., Santa Clara, CA (US)

(72) Inventor: Colin John Dickinson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 95 days.

(21) Appl. No.: 15/485,387

(22) Filed: Apr. 12, 2017

(65) Prior Publication Data

US 2017/0297066 A1 Oct. 19, 2017

Related U.S. Application Data

(60) Provisional application No. 62/352,240, filed on Jun. 20, 2016, provisional application No. 62/323,582, filed on Apr. 15, 2016.

(51) Int. Cl.
*B08B 7/00* (2006.01)
*H01J 37/32* (2006.01)
(Continued)

(52) U.S. Cl.
CPC ........ *B08B 7/0035* (2013.01); *C23C 16/4412* (2013.01); *C23C 16/50* (2013.01);
(Continued)

(58) Field of Classification Search
CPC .. B08B 7/0035; C23C 16/50; H01J 37/32009; H01J 37/32834;
(Continued)

(56) References Cited

U.S. PATENT DOCUMENTS 6,361,706 B1 3/2002 Gabriel
6,888,040 B1 * 5/2005 Shufflebotham ....... B01D 53/70 423/240 R
(Continued)

FOREIGN PATENT DOCUMENTS

EP 1 923 122 A1 5/2008
JP 2003282465 A 10/2003
(Continued)

OTHER PUBLICATIONS

Jae, et al.; Journal of Korea Society of Waste Management; A Study on Destruction Efficiency and Particulate By-Products of Sulfur Hexafluoride (SF6) Using High Ionization Energy With Oxygen, Water Vapor and Hydrogen; dated Aug. 30, 2013; 10 total pages.
(Continued)

*Primary Examiner* — Sharidan Carrillo
(74) *Attorney, Agent, or Firm* — Patterson + Sheridan, LLP

(57) ABSTRACT

Embodiments disclosed herein include a plasma abatement process that takes effluent from a processing chamber and reacts the effluent with water vapor reagent within a plasma source placed in a foreline by injecting the water vapor reagent into the foreline or the plasma source. The materials present in the effluent as well as the water vapor reagent are energized by the plasma source, converting the materials into gas species such as HF that is readily scrubbed by typical water scrubbing abatement technology. An oxygen containing gas is periodically injected into the foreline or the plasma source relative to the water vapor injection to reduce or avoid the generation of solid particles. The abatement process has good destruction removal efficiency (DRE) with minimized solid particle generation.

16 Claims, 7 Drawing Sheets

101, 109, 120, 122, 100, 121, 119, 152, 102, 104, 106, 107, 110, 112, 114, 130, 108, 140, 150, 116, 118

(51) Int. Cl.
*C23C 16/44* (2006.01)
*C23C 16/50* (2006.01)
*H01L 21/02* (2006.01)

(52) U.S. Cl.
CPC .. *H01J 37/32009* (2013.01); *H01J 37/32834* (2013.01); *H01J 37/32844* (2013.01); *H01L 21/02057* (2013.01); *H01J 2237/334* (2013.01); *Y02C 20/30* (2013.01)

(58) Field of Classification Search
CPC ........... H01J 37/32844; H01J 21/02057; H01J 2237/334; Y02C 20/30
See application file for complete search history.

(56) References Cited

U.S. PATENT DOCUMENTS

2002/0111045 A1 8/2002 Arno
2007/0169889 A1* 7/2007 Clark ..................... B01D 53/38 156/345.29
2008/0102011 A1 5/2008 Moalem et al.
2009/0314626 A1 12/2009 Moine et al.
2010/0258510 A1 10/2010 Hooshdaran et al.
2011/0135552 A1* 6/2011 Dickinson .............. B01D 53/32 423/235
2015/0251133 A1 9/2015 Cox et al.
2015/0252473 A1* 9/2015 Dickinson ........... C23C 16/4412 156/345.33
2016/0077508 A1* 3/2016 Schauer ................... G05B 9/02 700/99
2016/0089630 A1* 3/2016 Dickinson .............. B01D 53/68 423/240 R
2016/0166868 A1* 6/2016 Dickinson ........... H01J 7/32844 588/313

FOREIGN PATENT DOCUMENTS

KR 10-2012-0098861 9/2012
KR 10-2014-0104767 8/2014

OTHER PUBLICATIONS

PCT Notification of Transmittal of the International Search Report and the Written Opinion of the International Searching Authority for International Application No. PCT/US2017/024485; dated Jul. 6, 2017; 9 total pages.
Taiwanese Office Action (with attached English translation of the Search Report) for Application No. 106112529; dated Jan. 2, 2019; 10 total pages.
Office Action from Japanese Patent Application No. 2018-554346 dated Nov. 25, 2019.
Korean Office Action (with attached English translation of the Summary) for Application No. 10-2018-7032902; dated Sep. 19, 2019; 10 total pages.

* cited by examiner

PLASMA ABATEMENT SOLIDS AVOIDANCE BY USE OF OXYGEN PLASMA CLEANING CYCLE

CROSS-REFERENCE TO RELATED APPLICATIONS

This application claims priority to U.S. Provisional Patent Application Ser. No. 62/323,582, filed on Apr. 15, 2016, and U.S. Provisional Patent Application Ser. No. 62/352,240, filed on Jun. 20, 2016, which herein are incorporated by reference.

BACKGROUND

Field

Embodiments of the present disclosure generally relate to abatement for semiconductor processing equipment. More particularly, embodiments of the present disclosure relate to techniques for abating perfluorocarbon (PFC) gas present in the effluent of semiconductor manufacturing processes.

Description of the Related Art

Effluent produced during semiconductor manufacturing processes includes many compounds which must be abated or treated before disposal, due to regulatory requirements and environmental and safety concerns. Among these compounds are PFCs and halogen containing compounds, which are used, for example, in etching or cleaning processes.

PFCs, such as $CF_4$, $C_2F_6$, $NF_3$ and $SF_6$, are commonly used in the semiconductor and flat panel display manufacturing industries, for example, in dielectric layer etching and chamber cleaning. Following the manufacturing or cleaning process, there is typically a residual PFC content in the effluent gas stream pumped from the process tool. PFCs are difficult to remove from the effluent stream, and their release into the environment is undesirable because they are known to have relatively high greenhouse activity. Remote plasma sources (RPS) or in-line plasma sources (IPS) have been used for abatement of PFCs and other global warming gases.

The design of current abatement technology for abating PFC's utilizes either water vapor alone or with additional hydrogen as a reagent. Water vapor provides excellent destruction capability for PFC gases, but in some applications solid particles are generated in the plasma source, exhaust line and pump downstream of the plasma source. Thus, an improved abatement process is needed.

SUMMARY

In one embodiment, a method includes flowing an effluent from a processing chamber into an abatement system, the effluent includes a halogen, and the abatement system includes a foreline and a plasma source. The method further includes injecting an abating reagent into the abatement system, and forming a plasma using the plasma source. The effluent and the abating reagent are energized to form an abated material. The method further includes injecting an oxygen containing gas into the abatement system periodically relative to the injection of the abating reagent.

In another embodiment, a method includes flowing an effluent from a processing chamber into a foreline, and the effluent includes a halogen. The method further includes injecting an abating reagent into the foreline, and forming a plasma using a plasma source. The effluent and the abating reagent are energized to form an abated material. The method further includes injecting an oxygen containing gas into the abatement system periodically relative to the injection of the abating reagent.

In another embodiment, a method includes flowing an effluent from a processing chamber into a plasma source, and the effluent includes a halogen. The method further includes injecting an abating reagent into the plasma source, and forming a plasma using the plasma source. The effluent and the abating reagent are energized to form an abated material. The method further includes injecting an oxygen containing gas into the abatement system periodically relative to the injection of the abating reagent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments disclosed herein include a plasma abatement process that takes effluent from a processing chamber, such as a deposition chamber, an etch chamber or other vacuum processing chamber, and reacts the effluent with water vapor reagent within a plasma source placed in a foreline by injecting the water vapor reagent into the foreline or the plasma source. The materials present in the effluent as well as the water vapor reagent are energized by the plasma source, converting the materials into gas species such as HF that is readily scrubbed by typical water scrubbing abatement technology. An oxygen containing gas is periodically injected into the foreline or the plasma source while the water vapor injection is temporarily stopped. By removing the hydrogen radical effluent provided by the water vapor, the use of oxygen enables the presence of higher concentrations of fluorine radicals to reduce or avoid the generation of solid particles. The abatement process has good destruction removal efficiency (DRE) with minimized solid particle generation.

Figure 1A:
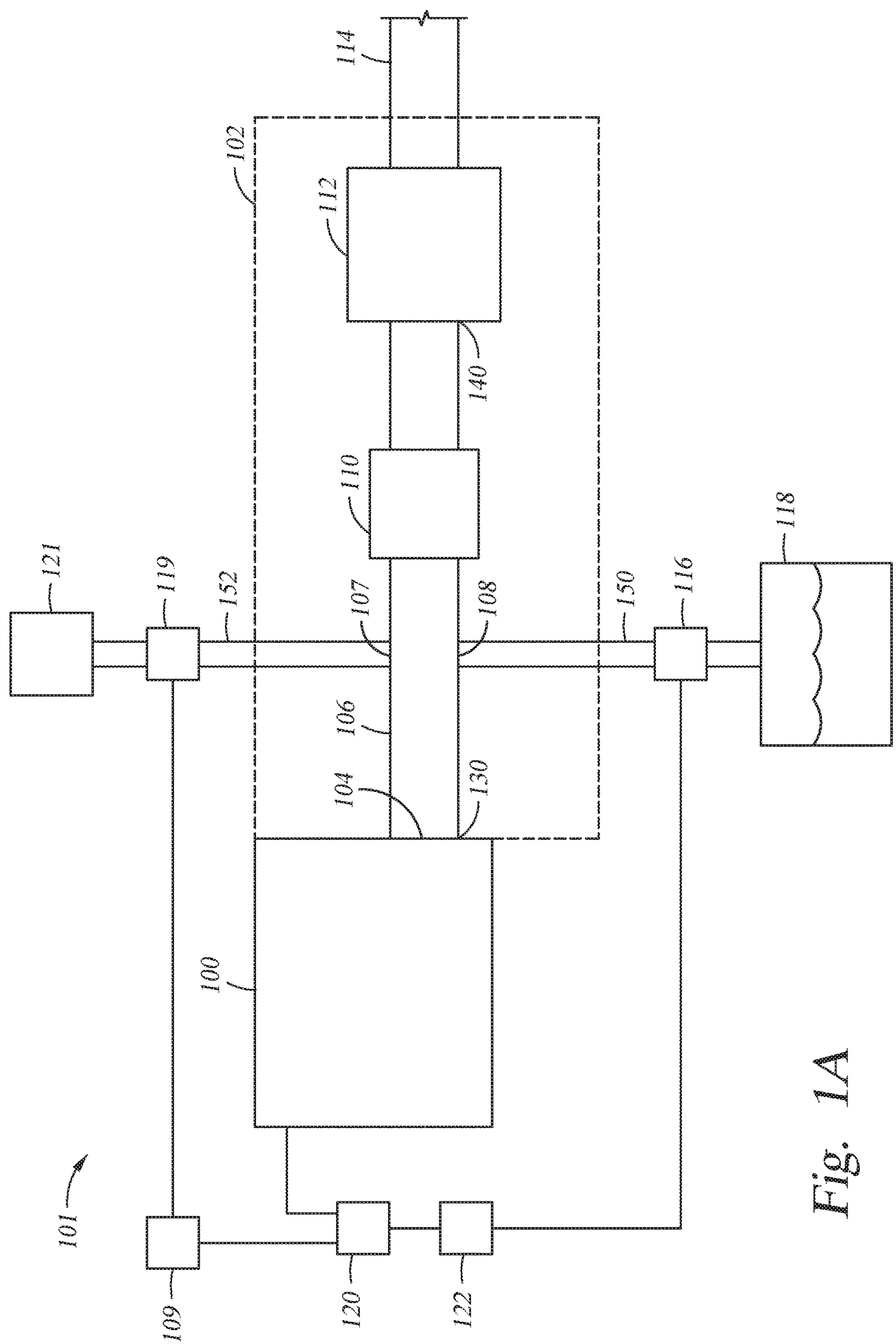
FIG. 1A is a schematic diagram of a processing system according to one embodiment described herein.

FIG. 1A is a schematic diagram of a processing system 101 according to one embodiment described herein. As shown in FIG. 1A, the processing system 101 includes a processing chamber 100 and an abatement system 102. The processing chamber 100 is generally configured to perform at least one integrated circuit manufacturing process, such as a deposition process, a clean process, an etch process, a plasma treatment process, a preclean process, an ion implant process, or other integrated circuit manufacturing process. The process performed in the processing chamber 100 may be plasma assisted. For example, the process performed in the processing chamber 100 may be a plasma etch process for etching a silicon-based material. In one embodiment, the processing chamber 100 is a plasma enhanced chemical vapor deposition (PECVD) chamber for depositing a silicon-based material.

The processing chamber 100 has a chamber exhaust port 104 coupled to a foreline 106 of the abatement system 102. A throttle valve (not shown) may be placed proximate the chamber exhaust port 104 for controlling the pressure inside the processing chamber 100. A first injection port 108 and a second injection port 107 may be formed in the foreline 106. The abatement system 102 further includes a vacuum pump 112 coupled to a second end 140 the foreline 106. A plasma source 110 is coupled in the foreline 106 at a location between the injection port 108 and the vacuum pump 112. The plasma source 110 may be a RPS an IPS, or any suitable plasma source. An exhaust line 114 is coupled to the pump 112 and may be connected to a facility exhaust (not shown).

The first injection port 108 formed in the foreline 106 is utilized for introducing an abating reagent into the foreline 106. The first injection port 108 may be connected to an abating reagent delivery system 118 via a conduit 150. The abating reagent delivery system 118 contains the abating reagent, and one or more valves 116 may be placed in the conduit 150 between the abating reagent delivery system 118 and the first injection port 108 to control the flow of the abating reagent. For example, the valves 116 between the abating reagent delivery system 118 and the first injection port 108 may include an isolation valve and a needle valve. The valves 116 may be connected to a controller 122, and the controller 122 may be connected to a system controller 120. In one embodiment, the abating reagent delivery system 118 is a low pressure boiler, and a liquid abating agent, such as liquid water, is disposed in the low pressure boiler. Alternatively, the abating reagent delivery system 118 may be a flash evaporator capable of turning liquid water into water vapor. An abating reagent in the form of a vapor, such as water vapor, is injected into the foreline 106 via the first injection port 108. A level sensor (not shown) may be located in the abating reagent delivery system 118 for providing a signal to a controller 122 that selectively opens a fill valve (not shown) to maintain the water level inside the abating reagent delivery system 118.

The flow rate of the abating reagent flowing into the foreline 106 may depend on the amount of PFCs or halogen containing compounds formed in the processing chamber 100. The flow rate of the abating reagent may be controlled by operation of the one or more valves 116. The one or more valves 116 may be any suitable valves for controlling the flow of the abating reagent. In one embodiment, the one or more valves 116 include a needle valve for fine tuning the control of the flow of the abating reagent. Information regarding the amount of PFCs or halogen containing compounds formed in the processing chamber 100 may be obtained by the system controller 120, which in turn signals the controller 122 to control the one or more valves 116.

The abating reagent, such as water vapor, is injected into the foreline and then flowed into the plasma source 110. A plasma is generated from the abating reagent within the plasma source 110, thereby energizing the abating reagent, and in some embodiments, also energizing the effluent. In some embodiments, at least some of the abating reagent and/or material entrained in the effluent are at least partially disassociated. The identity of the abating reagent, the flow rate of the abating reagent, the foreline gas injection parameters, and the plasma generation conditions may be determined based on the composition of the material entrained in the effluent and may be controlled by the controller 122. In some applications, such as etching of a silicon-based material, the effluent exiting the processing chamber 100 may include silicon, and solid particles, such as silicon oxide, may form in the plasma source 110 and exhaust line 114 and the pump 112 downstream of the plasma source 110.

In order to reduce or avoid the generation of solid particles, an oxygen containing gas is injected into the foreline 106 via the second injection port 107 periodically relative to the injection of the abating reagent. In order words, the oxygen containing gas is periodically injected into the foreline 106 via the second injection port 107 while the injection of the abating reagent is temporarily stopped. An oxygen containing gas delivery system 121 is connected to the second injection port 107 via a conduit 152. The oxygen containing gas delivery system 121 may be any suitable system for generating an oxygen containing gas, such as oxygen gas. One or more valves 119 may be placed in the conduit 152 between the oxygen containing gas delivery system 121 and the second injection port 107 to control the flow of the oxygen containing gas. For example, the valves 119 between the oxygen containing gas delivery system 121 and the second injection port 107 may include an isolation valve and a needle valve. The valves 119 may be connected to a controller 109, and the controller 109 may be connected to the system controller 120.

Figure 1B:
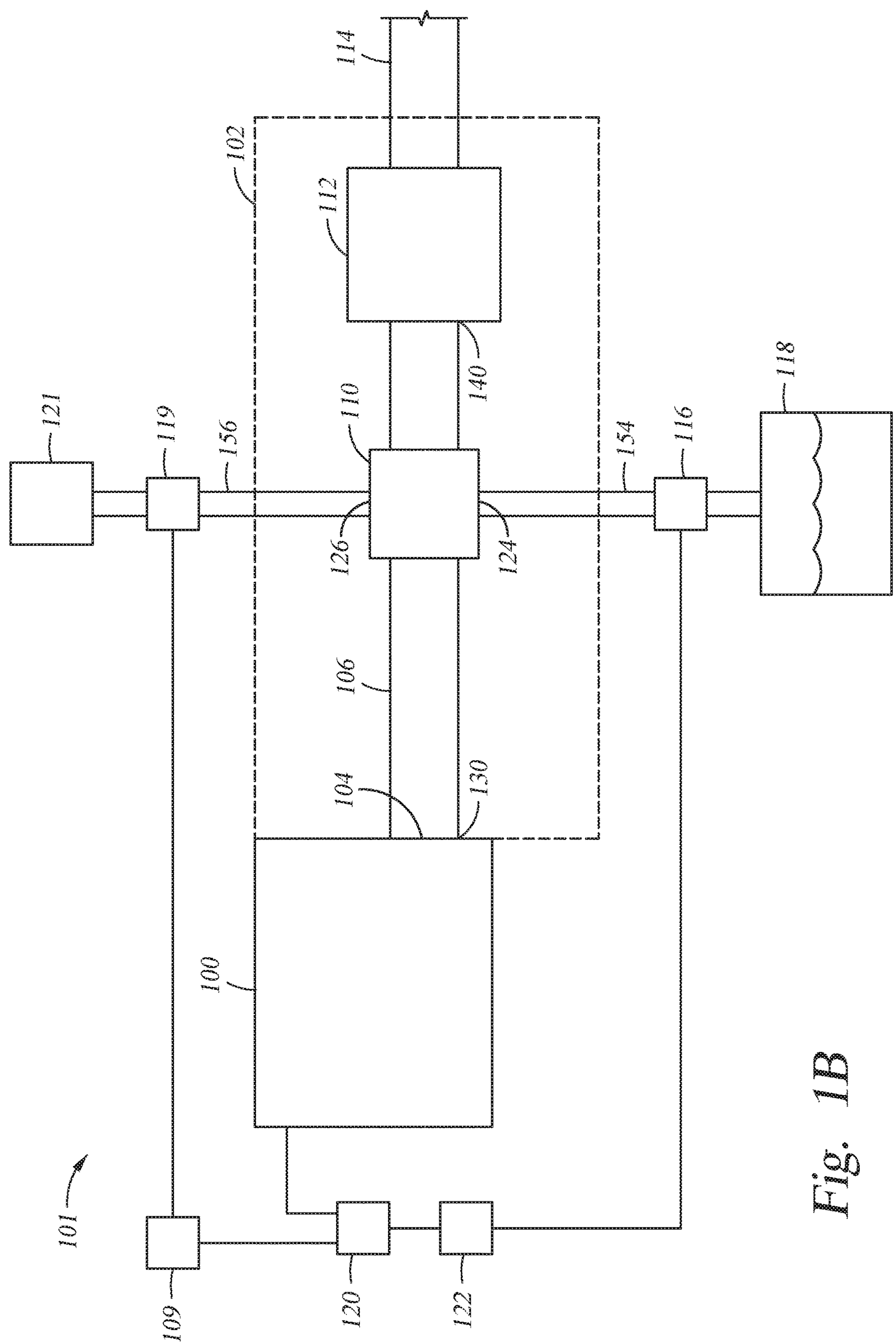
FIG. 1B is a schematic diagram of the processing system according to another embodiment described herein.

FIG. 1B is a schematic diagram of the processing system 101 according to one embodiment described herein. As shown in FIG. 1B, the abating reagent delivery system 118 and the oxygen containing gas delivery system 121 are connected to the plasma source 110 via conduits 154, 156, respectively. The plasma source 110 may include a first injection port 124, and the abating reagent delivery system 118 is connected to the first injection port 124 via the conduit 154 for injecting the abating reagent into the plasma source 110. The plasma source 110 may include a second injection port 126, and the oxygen containing gas delivery system 121 is connected to the second injection port 126 via the conduit 156 for injecting the oxygen containing gas into the plasma source 110. The one or more valves 116 may be placed in the conduit 154 between the abating reagent delivery system 118 and the first injection port 124 to control the flow of the abating reagent. The one or more valves 119 may be placed in the conduit 156 between the oxygen containing gas delivery system 121 and the second injection port 126 to control the flow of the oxygen containing gas. The processing chamber 100 and the remaining of the abatement system 102 may be the same as the processing system shown in FIG. 1A.

Figure 1C:
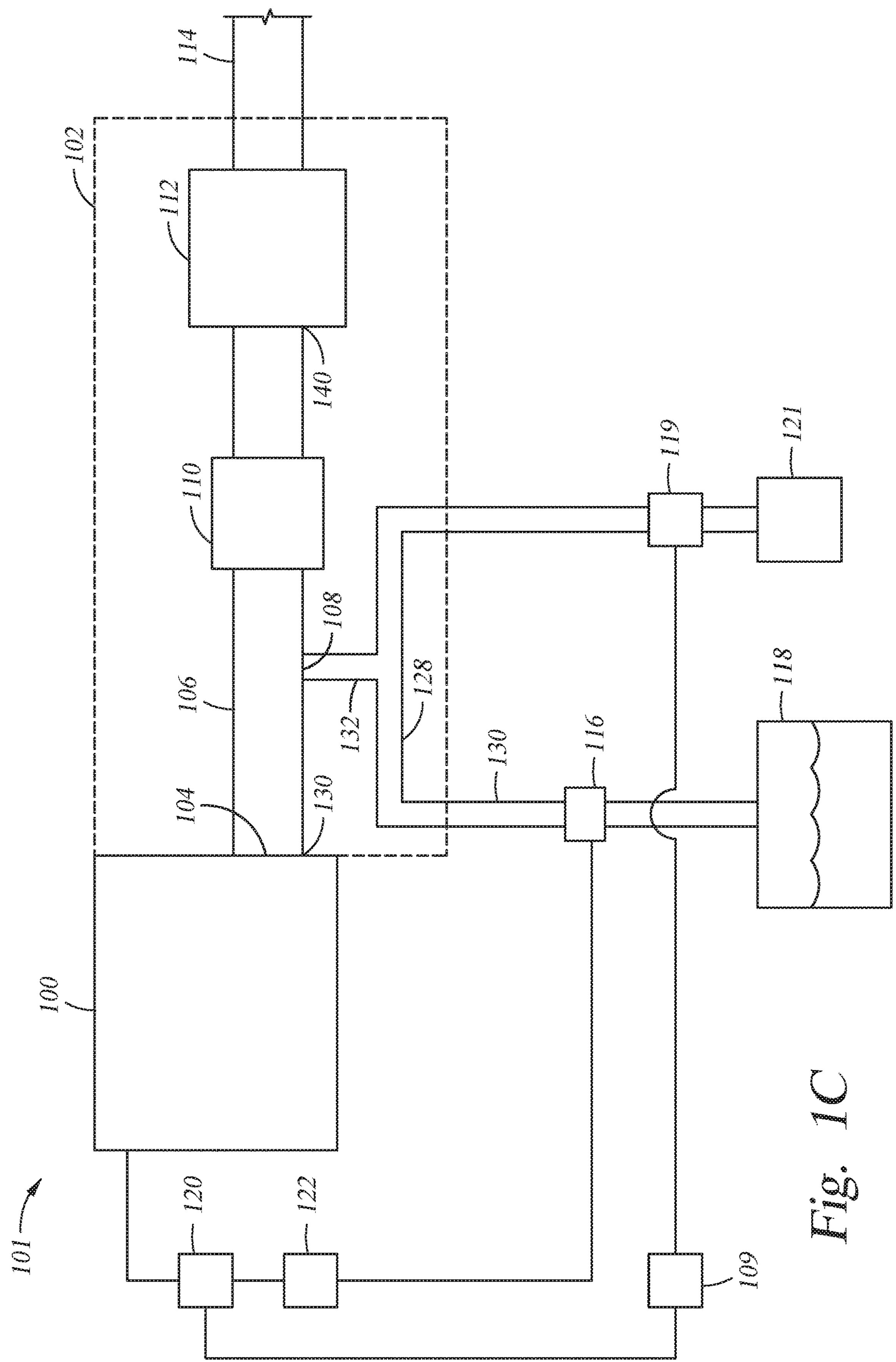
FIG. 1C is a schematic diagram of the processing system according to another embodiment described herein.

FIG. 1C is a schematic diagram of the processing system 101 according to one embodiment described herein. As shown in FIG. 1C, the abating reagent delivery system 118 and the oxygen containing gas delivery system 121 are connected to the injection port 108 in the foreline 106. A first conduit 132 may be connected to the injection port 108. A second conduit 128 may be connected to the first conduit 132 and the one or more valves 119. A third conduit 130 may be connected to the first conduit 132 and the one or more valves 116. The one or more valves 116 may be placed between the abating reagent delivery system 118 and the injection port 108 to control the flow of the abating reagent. The one or more valves 119 may be placed between the oxygen containing gas delivery system 121 and the injection port 108 to control the flow of the oxygen containing gas. During operation, either the valves 116 are open for injecting the abating reagent into the foreline 106 via the injection port 108 or the valves 119 are open for injecting the oxygen containing gas into the foreline 106 via the injection port 108. The processing chamber 100 and the remaining of the abatement system 102 may be the same as the processing system shown in FIG. 1A.

Figure 1D:
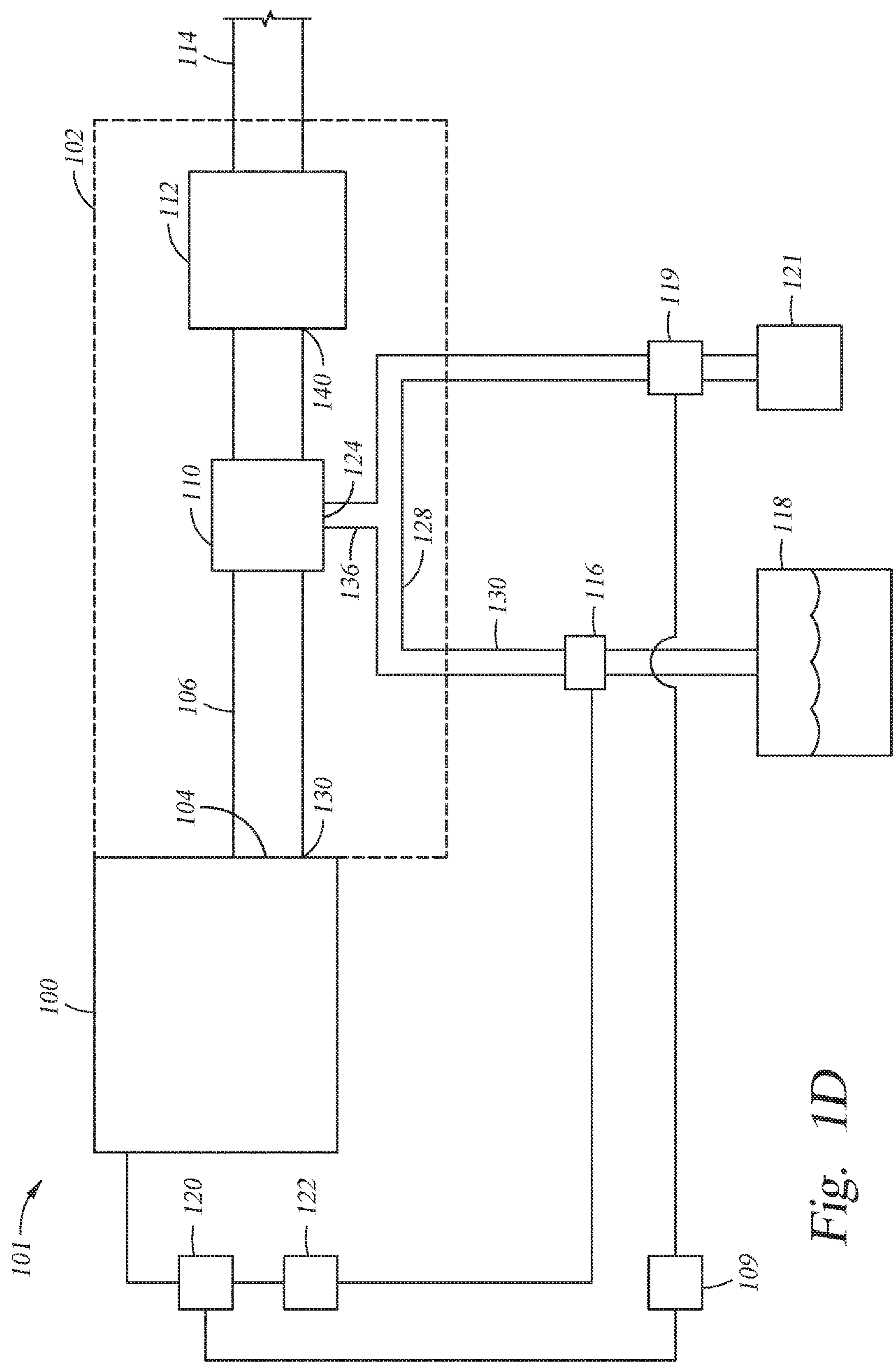
FIG. 1D is a schematic diagram of the processing system according to another embodiment described herein.

FIG. 1D is a schematic diagram of the processing system 101 according to one embodiment described herein. As shown in FIG. 1D, the abating reagent delivery system 118 and the oxygen containing gas delivery system 121 are connected to the injection port 124 in the plasma source 110. A conduit 136 may be connected to the injection port 124. The conduit 128 may be connected to the conduit 136 and the one or more valves 119. The conduit 130 may be connected to the conduit 136 and the one or more valves 116. The one or more valves 116 may be placed between the abating reagent delivery system 118 and the injection port 124 to control the flow of the abating reagent. The one or more valves 119 may be placed between the oxygen containing gas delivery system 121 and the injection port 124 to control the flow of the oxygen containing gas. During operation, either the valves 116 are open for injecting the abating reagent into the plasma source 110 via the injection port 124 or the valves 119 are open for injecting the oxygen containing gas into the plasma source 110 via the injection port 124. The processing chamber 100 and the remaining of the abatement system 102 may be the same as the processing system shown in FIG. 1A.

Figure 1E:
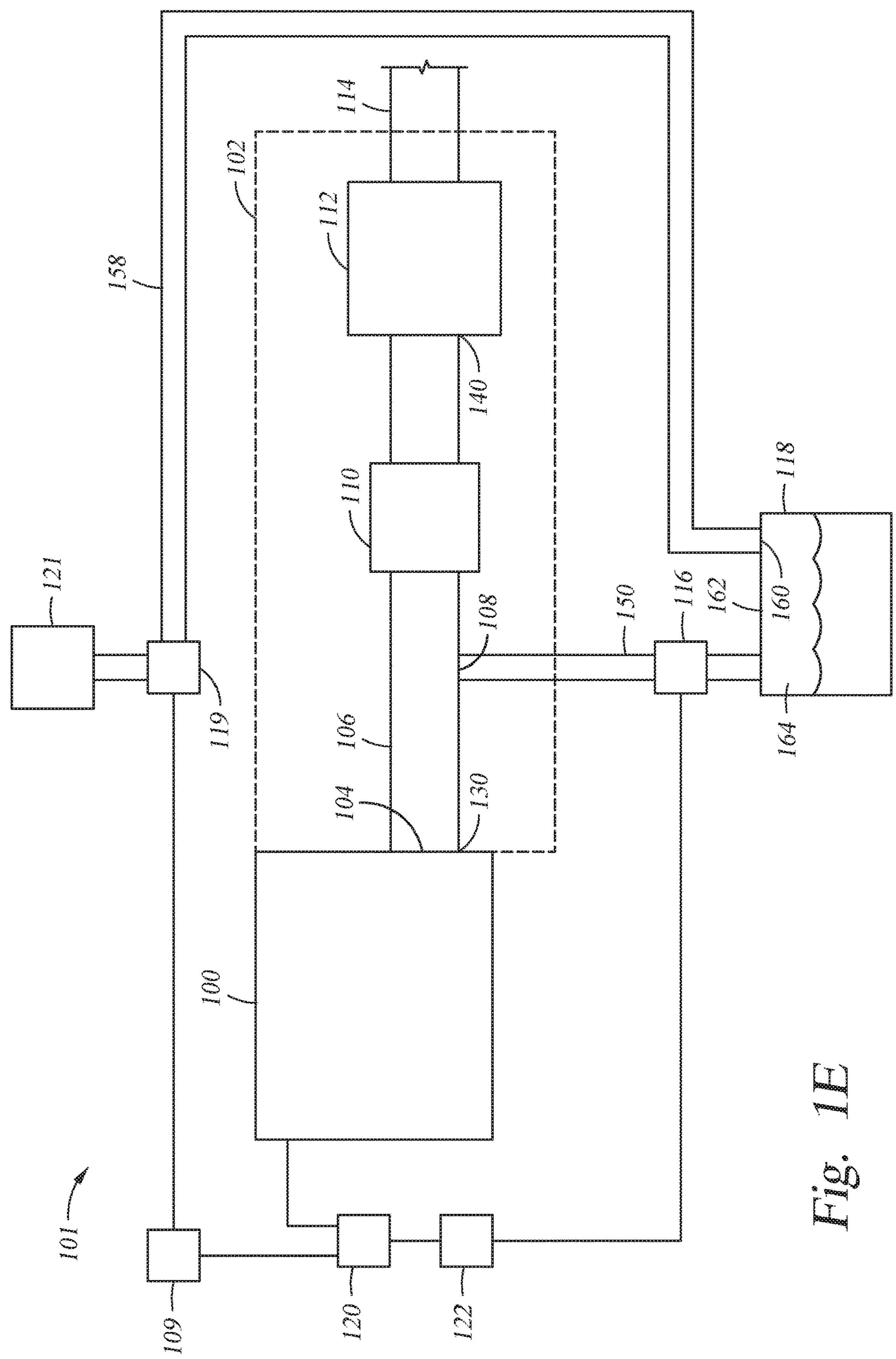
FIG. 1E is a schematic diagram of the processing system according to another embodiment described herein.

FIG. 1E is a schematic diagram of the processing system 101 according to another embodiment described herein. As shown in FIG. 1E, the oxygen containing gas delivery system 121 is not connected to the foreline 106, instead, the oxygen containing gas delivery system 121 is connected to the abating reagent delivery system 118 via a conduit 158. The abating reagent delivery system 118 is connected to the injection port 108 via the conduit 150, and the one or more valves 116 may be placed in the conduit 150 between the abating reagent delivery system 118 and the injection port 108 to control the flow of the abating reagent or the oxygen containing gas. The conduit 158 is connected to an injection port 160 located on a lid 162 of the abating reagent delivery system 118. The one or more valves 119 may be placed in the conduit 158 between the oxygen containing gas delivery system 121 and the abating reagent delivery system 118 to control the flow of the oxygen containing gas into the abating delivery system 118. During operation, the valves 116 are open for injecting the abating reagent or the oxygen containing gas into the foreline 106 via the injection port 108. The valves 119 are open for injecting the oxygen containing gas into a vapor head space 164 of the abating reagent delivery system 118. The oxygen containing gas is added to the vapor head space 160 of the abating reagent delivery system 118, which in turn increases the pressure inside the abating reagent delivery system 118. The increased pressure suppresses the boiling of the abating reagent in the abating reagent delivery system 118. Thus, the oxygen containing gas is flowed into the foreline 106 via the conduit 150, and no abating reagent is flowed into the foreline 106. The valves 116 are always open to allow either the abating reagent or the oxygen containing gas to flow into the foreline 106. The valves 119 are open to allow the oxygen containing gas to flow into the abating reagent delivery system 118 and the foreline 106. The processing chamber 100 and the remaining of the abatement system 102 may be the same as the processing system shown in FIG. 1A.

Figure 1F:
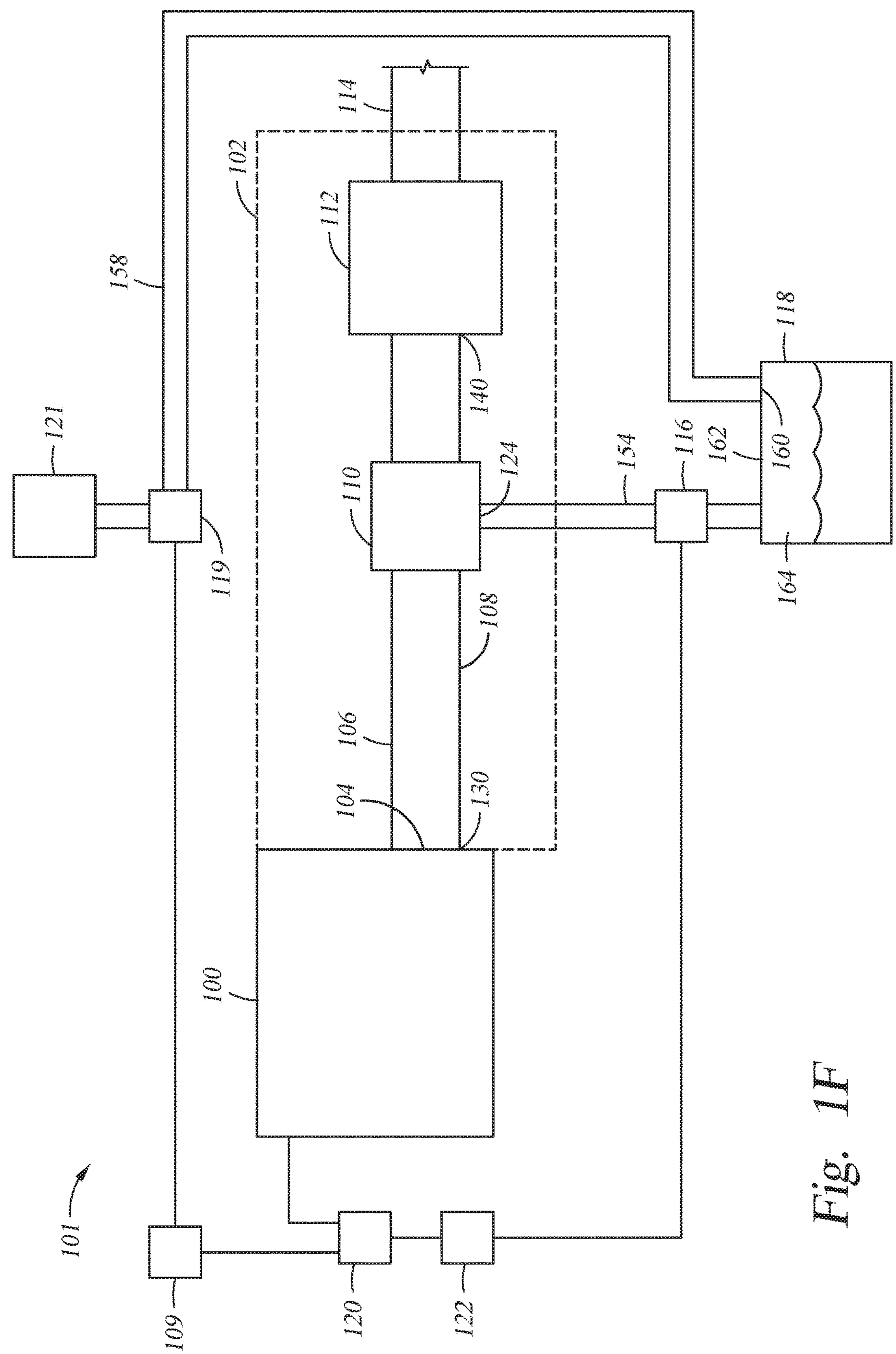
FIG. 1F is a schematic diagram of the processing system according to another embodiment described herein.

FIG. 1F is a schematic diagram of the processing system 101 according to another embodiment described herein. As shown in FIG. 1F, the oxygen containing gas delivery system 121 is not connected to the foreline 106, instead, the oxygen containing gas delivery system 121 is connected to the abating reagent delivery system 118 via the conduit 158. The abating reagent delivery system 118 is connected to the injection port 124 via the conduit 154, and the one or more valves 116 may be placed in the conduit 154 between the abating reagent delivery system 118 and the injection port 124 to control the flow of the abating reagent or the oxygen containing gas. The conduit 158 is connected to the injection port 160 located on the lid 162 of the abating reagent delivery system 118. The one or more valves 119 may be placed in the conduit 158 between the oxygen containing gas delivery system 121 and the abating reagent delivery system 118 to control the flow of the oxygen containing gas into the abating delivery system 118. During operation, the valves 116 are open for injecting the abating reagent or the oxygen containing gas into the plasma source 110 via the injection port 124. The valves 119 are open for injecting the oxygen containing gas into the vapor head space 164 of the abating reagent delivery system 118. The oxygen containing gas is added to the vapor head space 160 of the abating reagent delivery system 118, which in turn increases the pressure inside the abating reagent delivery system 118. The increased pressure suppresses the boiling of the abating reagent in the abating reagent delivery system 118. Thus, the oxygen containing gas is flowed into the plasma source 110 via the conduit 150, and no abating reagent is flowed into the plasma source 110. The valves 116 are always open to allow either the abating reagent or the oxygen containing gas to flow into the plasma source 110. The valves 119 are open to allow the oxygen containing gas to flow into the abating reagent delivery system 118 and the plasma source 110. The processing chamber 100 and the remaining of the abatement system 102 may be the same as the processing system shown in FIG. 1A.

Figure 2:
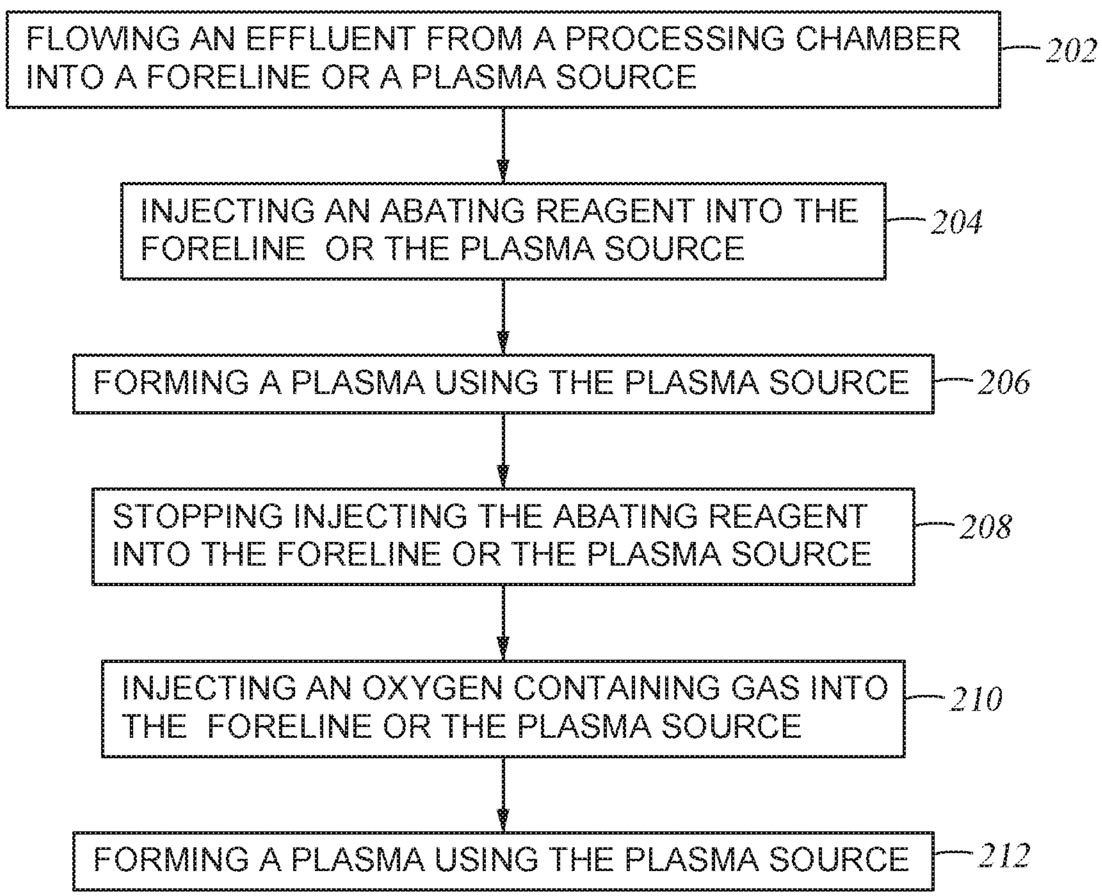
FIG. 2 is a flow diagram illustrating one method for abating effluent from a processing chamber, according to one embodiment described herein.

FIG. 2 is a flow diagram illustrating one embodiment of a method 200 for abating PFCs or halogen containing compounds from effluent exiting a processing chamber. The method 200 begins at block 202 by flowing an effluent from a processing chamber, such as the processing chamber 100, into a plasma source, such as plasma source 110, and the effluent includes a PFC or a halogen containing compound, such as $SiF_4$. At block 204, the method continues by injecting an abating reagent into either a foreline, such as the foreline 106, or the plasma source, such as the plasma source 110, via an injection port, such as the injection port 108 or 124. The abating reagent may be water vapor and may be generated in an abating reagent delivery system, such as the abating reagent delivery system 118. At block 206, the method continues by forming a plasma using the plasma source, and the effluent and the abating reagent are reacted and energized to convert PFCs or halogen containing compounds in the effluent to an abated material. In some embodiments, at least some of the abating reagent and/or material entrained in the effluent are at least partially dis-associated. The target material in the effluent is converted to an abated material in the presence of the plasma including the abating reagent formed in the plasma source. The material in the effluent may then exit the plasma source and flow into a pump, such as the pump 112, and/or be further treated.

The method described at blocks 204 and 206 may be performed when a substrate is being processed in the processing chamber or the processing chamber is being cleaned. For example, the method described at blocks 204 and 206 may be performed while an etching process is performed on a substrate in the processing chamber. When the processing chamber is idle, such as not running a process on a substrate disposed in the processing chamber or during transferring of a substrate into or out of the processing chamber, the method described at blocks 204 and 206 may be stopped. Thus, at block 208, the injection of the abating reagent into the foreline or the plasma source is stopped.

Solid particles may be formed in the plasma source as the result of reacting and energizing the abating reagent and the effluent. Next, at block 210, an oxygen containing gas is injected into the foreline or the plasma source via an injection port, such as one or more of the injection ports 107, 108, 124, or 126. The oxygen containing gas, such as oxygen gas or ozone, may be generated in an oxygen containing gas delivery system, such as the oxygen containing gas delivery system 121. Next, at block 212, a plasma is formed in the plasma source, and the oxygen containing gas is energized in the plasma source. The energized oxygen containing gas reduces or avoids the generation of solid particles in the plasma source and the equipment downstream of the plasma source.

The method described at blocks 210 and 212 may be performed while the processing chamber is idle or while processing a substrate within the processing chamber. In one example, the oxygen containing gas is injected into the foreline or the plasma source after the abating reagent stops being injected into the foreline or the plasma source. The abating reagent is injected into the foreline or the plasma source to convert the PFCs or the halogen containing compounds to an abated material. The oxygen containing gas is injected into the foreline or the plasma source to reduce or avoid the generation of solid particles formed by reacting and energizing the abating reagent and the PFCs or the halogen containing compounds. In one example, the abating reagent and the oxygen containing gas are not injected into the foreline or the plasma source at the same time. The abating reagent and the oxygen containing gas are injected into the foreline or the plasma source at different times in order to perform different tasks more efficiently.

In one example, the abating reagent is injected into the foreline or the plasma source during a first time period, and the oxygen containing gas is injected into the foreline or the plasma source during a second time period. The first time period may be 10 to 90 percent of the sum of the first and second time periods, and the second time period may be 10 to 90 percent of the sum of the first and second time periods. The first and second time periods do not overlap. In one example, no oxygen containing gas is injected during the first time period, while the abating reagent is not injected during the second time period. Alternatively, both oxygen containing gas and the abating reagent may be injected during transitions between one or both periods. In yet another embodiment, the abating reagent may be injected during both periods while the oxygen containing gas is injected only during the second period. In some embodiments, the second time period may occur while processing a substrate within the processing chamber, while in other embodiments the second time period occurs during the processing chamber idle time. In one embodiment, the first time period is 75 percent of the sum of the first and second time periods, and the second time period is 25 percent of the sum of the first and second time periods. The amount of time in the first time period and the second time period may be controlled by the system controller 120.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. A method, comprising:

flowing an effluent from a processing chamber into an abatement system, wherein the effluent comprises a halogen, and wherein the abatement system comprises a foreline and a plasma source;

injecting an abating reagent into the abatement system from an abating reagent delivery system;

forming a plasma using the plasma source, wherein the effluent and the abating reagent are energized to form an abated material;

injecting an oxygen containing gas into the abating reagent delivery system, wherein the injecting the oxygen containing gas increases a pressure inside of the abating reagent delivery system, wherein the increased pressure suppresses a boiling point of the abating reagent and stops the abating reagent from flowing into the abatement system; and injecting the oxygen containing gas into the abatement system.

2. The method of claim 1, wherein the abating reagent comprises water vapor.

3. The method of claim 1, wherein the oxygen containing gas comprises oxygen gas or ozone.

4. The method of claim 1, wherein the abating reagent is injected into the abatement system during a first time period and the oxygen containing gas is injected into the abatement system during a second time period.

5. The method of claim 4, wherein the first time period is about 10 to 90 percent of a sum of the first and second time periods, and the second time period is about 10 to 90 percent of the sum of the first and second time periods.

6. A method, comprising:

flowing an effluent from a processing chamber into a foreline, wherein the effluent comprises a halogen;

injecting an abating reagent into the foreline from an abating reagent delivery system;

forming a plasma using a plasma source connected in the foreline, wherein the effluent and the abating reagent are energized to form an abated material;

injecting an oxygen containing gas into the abating reagent delivery system, wherein the injecting the oxygen containing gas increases a pressure inside of the abating reagent delivery system, wherein the increased pressure suppresses a boiling point of the abating reagent and stops the abating reagent from flowing into the foreline; and injecting the oxygen containing gas into the foreline.

7. The method of claim 6, wherein the abating reagent comprises water vapor.

8. The method of claim 6, wherein the oxygen containing gas comprises oxygen gas or ozone.

9. The method of claim 6, wherein the abating reagent is injected into the foreline during a first time period and the oxygen containing gas is injected into the foreline during a second time period.

10. The method of claim 9, wherein the first time period is about 10 to 90 percent of a sum of the first and second time periods, and the second time period is about 10 to 90 percent of the sum of the first and second time periods.

11. The method of claim 9, wherein the first time period and the second time period do not overlap.

12. A method, comprising:

flowing an effluent from a processing chamber into a plasma source, wherein the effluent comprises a halogen;

injecting an abating reagent into the plasma source from an abating reagent delivery system;

forming a plasma using the plasma source, wherein the effluent and the abating reagent are energized to form an abated material;

injecting an oxygen containing gas into the abating reagent delivery system, wherein the injecting the oxygen containing gas increases a pressure inside of the abating reagent delivery system, wherein the increased pressure suppresses a boiling point of the abating reagent and stops the abating reagent from flowing into the plasma source; and injecting the oxygen containing gas into the plasma source.

13. The method of claim 12, wherein the abating reagent comprises water vapor.

14. The method of claim 12, wherein the oxygen containing gas comprises oxygen gas or ozone.

15. The method of claim 12, wherein the abating reagent is injected into the plasma source during a first time period and the oxygen containing gas is injected into the plasma source during a second time period.

16. The method of claim 15, wherein the first time period is about 10 to 90 percent of a sum of the first and second time periods, and the second time period is about 10 to 90 percent of the sum of the first and second time periods.

* * * * *